(12) United States Patent
Chun et al.

(10) Patent No.: US 7,542,354 B2
(45) Date of Patent: Jun. 2, 2009

(54) REPROGRAMMABLE NONVOLATILE MEMORY DEVICES AND METHODS

(75) Inventors: Jin-Young Chun, Seoul (KR); Jae-Yong Jeong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 56 days.

(21) Appl. No.: 11/634,058

(22) Filed: Dec. 5, 2006

(65) Prior Publication Data
US 2007/0183216 A1 Aug. 9, 2007

(30) Foreign Application Priority Data
Jan. 31, 2006 (KR) .................... 10-2006-0009365

(51) Int. Cl.
*G11C 11/34* (2006.01)
(52) U.S. Cl. .................... 365/185.33; 365/185.22; 365/185.25
(58) Field of Classification Search ............ 365/185.05, 365/185.11, 185.13, 185.29, 185.33, 185.12, 365/185.24, 185.25, 185.22
See application file for complete search history.

(56) References Cited

U.S. PATENT DOCUMENTS

| | | | | |
|---|---|---|---|---|
| 5,734,919 A | * | 3/1998 | Walsh et al. ............ | 365/185.13 |
| 5,805,501 A | * | 9/1998 | Shiau et al. ............ | 365/185.33 |
| 5,937,424 A | * | 8/1999 | Leak et al. ............ | 365/185.33 |
| 5,943,692 A | * | 8/1999 | Marberg et al. ........ | 365/185.33 |
| 6,137,729 A | * | 10/2000 | Choi ...................... | 365/185.29 |
| 6,166,959 A | | 12/2000 | Gupta | |
| 6,829,672 B1 | * | 12/2004 | Deng et al. ............ | 365/185.33 |

FOREIGN PATENT DOCUMENTS

| | | |
|---|---|---|
| JP | 09-106687 | 4/1997 |
| JP | 11-162182 | 6/1999 |
| JP | 2002-525778 | 8/2002 |
| KR | 2001-0103582 | 11/2001 |
| WO | WO 00/16338 | 3/2000 |

OTHER PUBLICATIONS

Mokhlesi, Patent Application Publication US 2007/0297226 A1 (U.S. Appl. No. 11/425,790).*

* cited by examiner

*Primary Examiner*—Trong Phan
(74) *Attorney, Agent, or Firm*—Myers Bigel Sibley & Sajovec

(57) ABSTRACT

A nonvolatile memory device includes a command decoder configured to generate a read/write flag signal in response to a read/write command and to generate a reprogram flag signal in response to a reprogram command, and a read/write circuit configured to control reading and writing operations in a memory cell array. The device further includes a read/write controller configured to cause the read/write circuit to perform a reading/writing operation in response to the read/write flag signal provided from the command decoder, and a reprogram controller configured to cause the read/write controller to perform a reprogramming operation in response to the reprogram flag signal. Methods of reprogramming a memory device include determining whether the memory device is in a busy state, delaying a reprogramming operation if the memory device is in a busy state, and executing the reprogramming operation when the memory device has turned to a standby state from the busy state.

26 Claims, 5 Drawing Sheets

REPROGRAMMABLE NONVOLATILE MEMORY DEVICES AND METHODS

CROSS-REFERENCE TO RELATED APPLICATION

This patent application claims priority under 35 U.S.C. § 119 to Korean Patent Application No. 10-2006-0009365 filed on Jan. 31, 2006, the disclosure of which is hereby incorporated herein by reference.

FIELD OF THE INVENTION

The present invention relates to semiconductor memory devices, and more particularly, to nonvolatile semiconductor memory devices.

BACKGROUND

Flash memory devices are nonvolatile semiconductor memory devices that are electrically erasable and programmable. In flash memory devices, multiple memory blocks may be written with data in a single programming operation. In general, in a flash memory device, one memory block is erasable or programmable at a time. This means that flash memory devices may more rapidly and/or effectively read and/or write data when systems employing such flash memory devices read and write data in blocks. Flash memory devices usually include insulation films that enclose charge storage elements used for storing data. These insulation films may become worn out after a certain number of read/write operations.

Flash memory devices may continue to store data even when power is not supplied to the chip. That is, flash memory devices may be able to retain stored information therein without consuming a substantial amount of power even after the power supply to the chips has been interrupted. In addition, flash memory devices may offer resistance to physical shocks and/or fast read access times. Due in part to such features, flash memory devices are widely used as storage units in battery powered electronic devices. Flash memory devices are generally classified as NOR or NAND-type devices depending on the logical arrangement of gates in the memory.

In a flash memory device, information is stored in an array of transistors, each of which acts as a unit cell storing one bit of information. Some types of advanced flash memory devices, called multi-level flash memory devices, are capable of storing more than one data bit in a unit cell by varying the amount of electric charge stored in a floating gate of cell.

A unit cell of a flash memory device may have a structure similar to a typical MOSFET, but with two gates. In particular, a flash memory cell typically includes a control gate, such as the gate included in a conventional MOSFET device. In addition, a flash memory cell may also include a floating gate enclosed by an insulation film and disposed between the control gate and the substrate. The floating gate is isolated from peripheral conductors by the insulation film, and electrons are captured in the floating gate to preserve information without leakage. Electrons captured in the floating gate change an electric field between the control gate and the substrate, which may vary a threshold voltage of the cell. Thus, in order to read a data bit from the cell, a specific voltage is applied to the control gate. In response to the gate voltage, a current may flow, or not flow, through the cell depending on the threshold voltage of the cell. Since the threshold voltage of the cell is affected by the amount of charge accumulated in the floating gate, it is possible to determine if a data 1 or data 0 is stored in the cell by detecting a flow of current through the cell in response to the gate voltage.

A flash memory cell may experience a lowering of the threshold voltage over time, possibly due to an effect called hot temperature stress (HTS). HTS may cause electric charges, which are accumulated in the floating gate of a programmed memory cell, to flow out of the floating gate and into the substrate or bulk layer. As the charge in the floating gate of a programmed memory cell decreases, the threshold voltage of the memory cell may become lower, as indicated by the dotted lines in FIG. 1. That is, FIG. 1 shows a range of threshold voltages corresponding to a first memory state (ST0) and a second memory state (ST1). The distance between the threshold voltages for the first and second memory states, referred to as the read margin, is shown as RM1 before the effects of HTS and RM2 after the effects of HTS. As illustrated in FIG. 1, a lowering of the threshold voltage of a programmed memory cell due to HTS may result in a reduced read margin between states (RM1>RM2). Such a reduction of read margin may reduce the reliability of a memory device and/or increase the probability of data or read errors. The effects of HTS may become even more pronounced as device feature sizes are made smaller and smaller to accommodate higher device densities.

The lowering of threshold voltage, such as lowering of threshold voltages due to HTS, can be addressed by detecting memory cells with lowered threshold voltages and reprogramming the memory cells that have lowered threshold voltages. This operation is referred to as a 'reprogramming operation' or 'refresh-programming operation'. A reprogramming operation may be carried out for all the memory cells of a memory, in which case it may take a very long time to complete the reprogramming operation, during which time a reading and/or writing operation requested by a host or memory controller may be delayed. This may degrade the performance of a system employing such a flash memory.

It is known to temporarily suspend a reprogramming operation of a flash memory device using a suspending/resuming function. When a reprogramming operation of a flash memory device is suspended by a host or memory controller, a requested read or write operation is conducted, after which the interrupted reprogramming operation may resume. Such an operation may reduce the standby time of the host or memory controller. However, since the host or memory controller may provide suspend/resume commands to a flash memory device, the host or memory controller may be required to conduct complex control operations for reprogramming data in the flash memory device.

SUMMARY

A nonvolatile memory device according to some embodiments of the invention includes a memory cell array, a command decoder configured to generate a read/write flag signal in response to a read/write command and to generate a reprogram flag signal in response to a reprogram command, and a read/write circuit configured to control reading and writing operations in the memory cell array. The device further includes a read/write controller configured to cause the read/write circuit to perform a reading/writing operation in response to the read/write flag signal provided from the command decoder, and a reprogram controller configured to cause the read/write controller to perform a reprogramming operation in response to the reprogram flag signal provided from the command decoder.

The command decoder may be configured to determine, in response to a reprogramming command, whether a reading/ writing operation is being carried out in the memory cell array. The command decoder may be further configured to delay the reprogramming operation until the reading/writing operation is complete if the reading/writing operation is being carried out when the reprogramming command is received by the command decoder. The command decoder may be further configured to provide the reprogram controller with a reprogram flag signal to cause a delayed reprogramming operation to be initiated when the reading/writing operation is complete.

The nonvolatile memory device may further include a suspend/resume controller configured to suspend an operation controlled by the reprogram controller or the read/write controller in response to a suspend flag signal provided from the command decoder. The command decoder may be configured to provide the suspend/resume controller with a suspend flag signal to suspend the reprogramming operation in response to receipt of the read/write command during the reprogramming operation.

The command decoder may be configured to provide the read/write flag signal to the read/write controller in response to suspension of the reprogramming operation and configured to provide the suspend/resume controller with a resume flag signal to resume the suspended reprogramming operation when the reading/writing operation is terminated.

The nonvolatile memory device may further include an address generator configured to generate a reprogram address for the reprogramming operation. The address generator may be configured to provide the reprogram address to the read/write circuit. The reprogram controller may be configured to initialize the address generator in response to the reprogram flag signal from the command decoder. The address generator may be configured to maintain the reprogram address to be used in resuming the suspended reprogramming operation when the reprogramming operation is suspended.

The command decoder may be configured to receive the input information for the reprogramming operation from an external memory controller, a timer and/or a power-on reset circuit. The command decoder may be further configured to provide the reprogram controller with a flag signal indicative of the reprogramming operation in response to the reprogram enable signal.

The nonvolatile memory device may further include a timer configured to generate a reprogram enable signal in response to the passing of a predetermined time for the reprogramming operation.

The nonvolatile memory device may further include a power-on reset circuit configured to generate initializing information at a power-on time. The command decoder may be configured to provide the reprogram controller with a flag signal indicative of the reprogramming operation in response to the initializing information.

A memory system according to some embodiments of the invention includes a memory controller configured to generate a reprogram command indicative of a reprogramming operation and a read/write command indicative of a read/write operation, and a nonvolatile memory device. The nonvolatile memory device includes a memory cell array, a command decoder configured to generate a read/write flag signal in response to the read/write command from the memory controller and to generate a reprogram flag signal in response to the reprogram command from the memory controller, a read/write circuit configured to control reading and writing operations in the memory cell array, a read/write controller configured to cause the read/write circuit to perform a reading/writing operation in response to the read/write flag signal provided from the command decoder, and a reprogram controller configured to cause the read/write controller to perform a reprogramming operation in response to the reprogram flag signal provided from the command decoder.

The memory controller may include a timer configured to count a predetermined time for the reprogramming operation and configured to provide the command decoder with the reprogram command in response to the passing of the predetermined time.

Some embodiments of the invention provide methods of operating a nonvolatile memory device. The methods include receiving a signal indicative of a reprogramming operation, determining whether the memory device is in a busy state in response to the signal indicative of the reprogramming operation, delaying the reprogramming operation if the memory device is in the busy state, determining when the memory device has transitioned from the busy state to a standby state, and executing the delayed reprogramming operation when the memory device has turned to the standby state from the busy state.

The methods may further include suspending the reprogramming operation in response to a request for a reading/writing operation during the reprogramming operation. The methods may further include resuming the suspended reprogramming operation in response to a completion of the requested reading/writing operation.

The signal informing of the reprogramming operation may be provided from an external memory controller. The external memory controller may generate the signal indicative of the reprogramming operation in response to an external request. In some embodiments, the external memory controller may generate a signal indicative of the reprogramming operation at predetermined time intervals.

In some embodiments, the signal indicative of the reprogramming operation may be generated from a timer included in the nonvolatile memory device. In further embodiments, the signal indicative of the reprogramming operation is generated from a power-on reset circuit coupled to the nonvolatile memory device.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
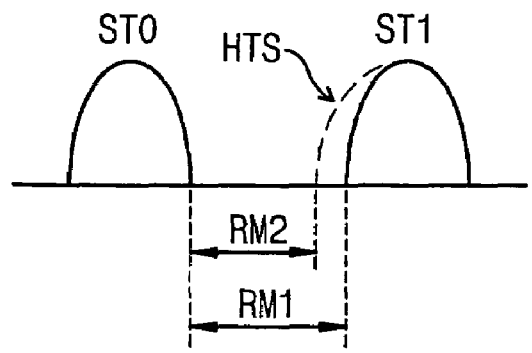
FIG. 1 is a schematic diagram showing a reduction of read margin of a semiconductor memory device due to hot temperature stress.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The present invention is described below with reference to flowchart illustrations and/or block diagrams of methods, systems and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Figure 2:
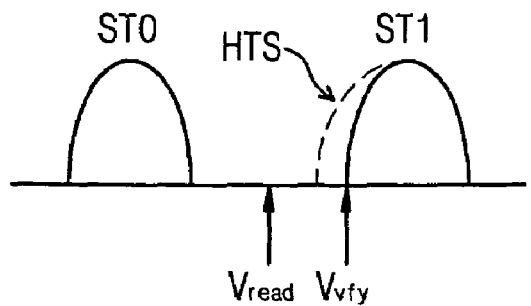
FIG. 2 is a schematic diagram showing reprogramming operations in a nonvolatile memory device according to some embodiments of the present invention.

A reprogramming, or refresh-programming, operation for compensating reduced read margins that may be caused by HTS will now be described. A memory cell having a reduced threshold voltage may be detected using two read operations. For instance, as illustrated in FIG. 2, a first read operation is carried out by applying a read voltage Vread to a selected word line. Another read operation is carried out by applying a verifying voltage Vvfy to the selected word line. These read operations detect memory cells having thresholds voltages between the read voltage Vread and the verifying voltage Vvfy. Such memory cells may be reprogrammed to have threshold voltages equal to or higher than the verifying voltage Vvfy. These operations may be repeated for each of the word lines in the flash memory device.

FIG. 2 shows two threshold voltage states (ST0 and ST1) of a memory cell that stores one bit of data; however, the present invention is not limited to devices having memory cells configured to store only a single bit of data. For example, the present invention may be advantageously employed in a semiconductor memory device including memory cells that are configured to store N-bit data (where N is 2 or an integer larger than 2) in a plurality of threshold voltage states.

Figure 3:
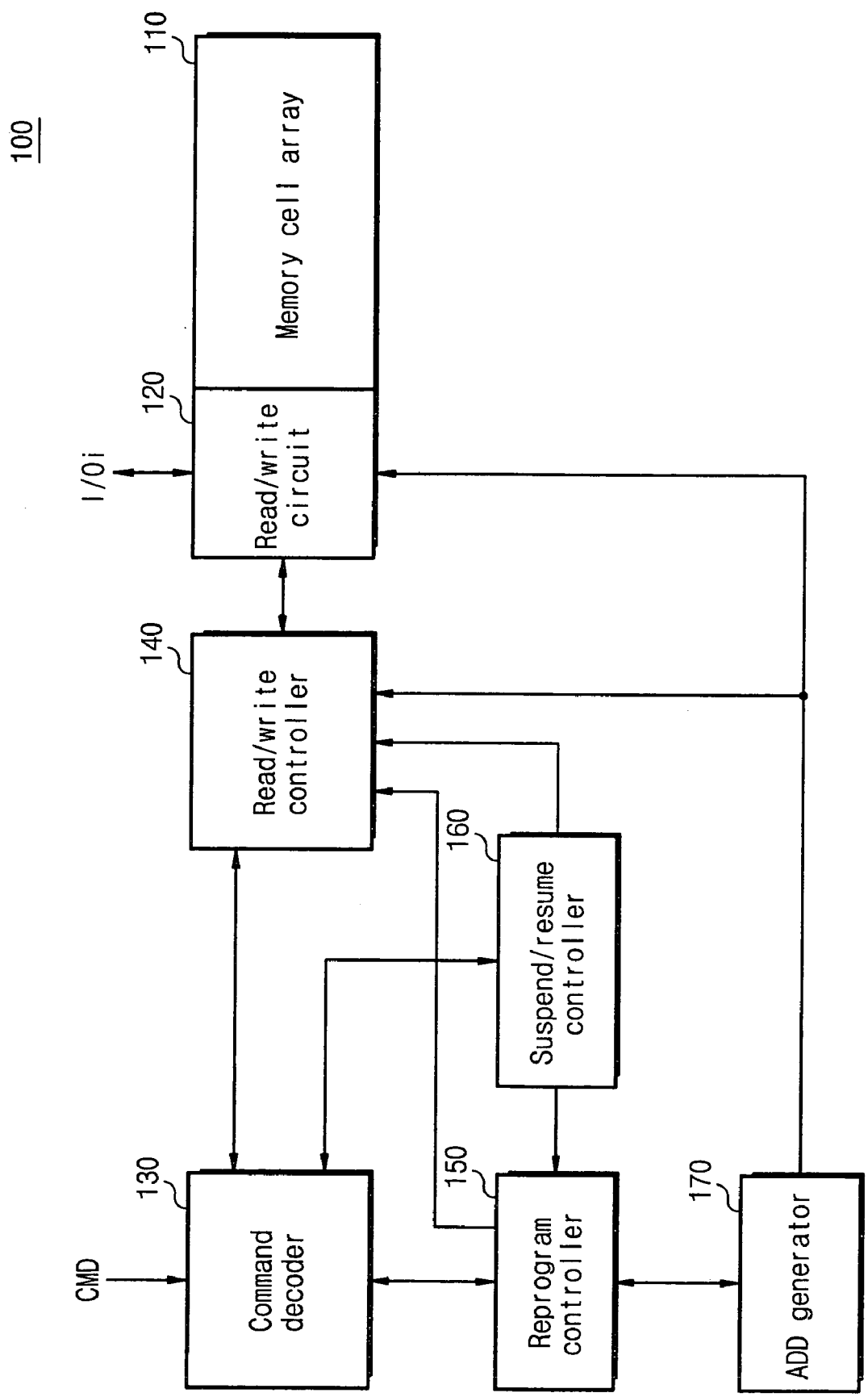
FIG. 3 is a block diagram illustrating nonvolatile memory devices and/or methods in accordance with some embodiments of the present invention.

FIG. 3 is a block diagram illustrating nonvolatile memory devices and/or methods in accordance with some embodiments of the present invention.

Referring to FIG. 3, a nonvolatile memory device 100 includes a memory cell array 110 configured to store digital data, which may include 1-bit data or N-bit data. Although not shown in FIG. 3, the memory cell array may be constructed with memory cells arranged in a matrix of rows (or word lines) and columns (or bit lines). Each memory cell may include a floating-gate transistor as described above. A read/write circuit 120 is configured to conduct reading and writing operations I/Oi for the memory cell array 110. Writing operations can include programming and/or erasing operations. Although not shown in FIG. 3, the read/write circuit 120 may include row and column selection circuits, sense amplifiers, write drivers, a high voltage generator, and so on.

As shown in FIG. 3, the nonvolatile memory device 100 may also include a command decoder 130, a read/write controller 140, a reprogram controller 150, a suspend/resume controller 160, and an address generator 170.

The command decoder 130 is configured to decode commands CMD supplied from an external host or memory controller. When the input command CMD is a normal read/write command, the command decoder 130 provides the read/write controller 140 with a read/write flag signal indicating that a normal read/write command has been input. When the input command CMD is a suspend/resume command, the command decoder 130 may provide the suspend/resume controller 160 with a suspend/resume flag signal indicating the input of a suspend/resume command. If a reprogram command is input to the command decoder 130 during a normal reading or writing operation, the command decoder 130 may wait for an end of the reading or writing operation before executing the reprogramming command. Once the reading or writing operation has ended, the command decoder 130 may provide the reprogram controller 150 with a reprogram flag signal. On the other hand, if a normal read/write command is input during a reprogramming operation, the command decoder 130 may provide the suspend/resume controller 160 with a suspend flag signal to interrupt the reprogramming operation. After completing the read/write operation in response to the input commands, the command decoder 130 may provide the suspend/resume controller 160 with a resume flag signal to resume the suspended reprogramming operation.

The read/write controller 140 may cause the read/write circuit 120 to conduct reading and/or writing operations in response to a read/write signal provided from the command decoder 130. Address information for a normal reading and/or writing operation may be provided to the read/write circuit 120. During the reading and/or writing operation, the read/write controller 140 may provide the command decoder 130 with a busy flag signal indicating that a reading and/or writing operation is being carried out.

When a reprogram flag signal is provided to the reprogram controller 150, the reprogram controller 150 initializes the address generator 170. The address generator 170 generates address signals to select the word lines of the memory cell array 110 in sequence, under the control of the reprogram controller 150. The address signals are provided to the read/write circuit 120. The reprogram controller 150 also causes the read/write controller 140 to control the reprogramming operation in the manner described above. That is, during reprogramming operations, the read/write controller 140 operates the read/write circuit 120 under control of the reprogram controller 150. During the reprogramming operation, the reprogram controller 150 provides the command decoder 130 with a busy flag signal indicating that a reprogramming operation is being carried out.

The suspend/resume controller 160 may be configured to cause the read/write controller 140 and/or the reprogram controller 150 to suspend a current operation when the suspend flag signal is provided from the command decoder 130. For example, when a suspend flag signal is input during a normal reading/writing operation, the suspend/resume controller 160 may cause the read/write controller 140 to suspend the reading/writing operation. Information relevant to the reading/writing operation may be temporarily stored in the read/write controller 140. If the suspend flag signal is input during a reprogramming operation, the suspend/resume controller 160 may cause the reprogram controller 150 to suspend the reprogramming operation. In response, some information relevant to the reprogramming operation (such as reprogramming addresses) may be retained by the address generator 170. When a resume flag signal is input from the command decoder 130, the suspend/resume controller 160 may cause the read/write controller 140 and/or the reprogram controller 150 to resume the suspended operation.

Accordingly, a nonvolatile memory device 100 according to some embodiments of the invention may automatically conduct a reprogramming operation when a reprogram command is received from an external host or memory controller. If a command, such as a read/write command, is input during a reprogramming operation, the reprogramming operation may be automatically suspended. The suspended reprogramming operation may be automatically resumed after completion of the read/write operation. That is, the suspended operation may be resumed without requiring an external resume command. As the reprogramming operation may be carried out without intervention by the memory controller or host, it may be possible to avoid having to implement a complex control procedure (e.g., for providing the suspend/resume commands to the memory device by the host or memory controller at a proper time). Thus, it may be possible to provide improved performance in a system employing a nonvolatile memory device according to some embodiments of the invention.

Figure 4:
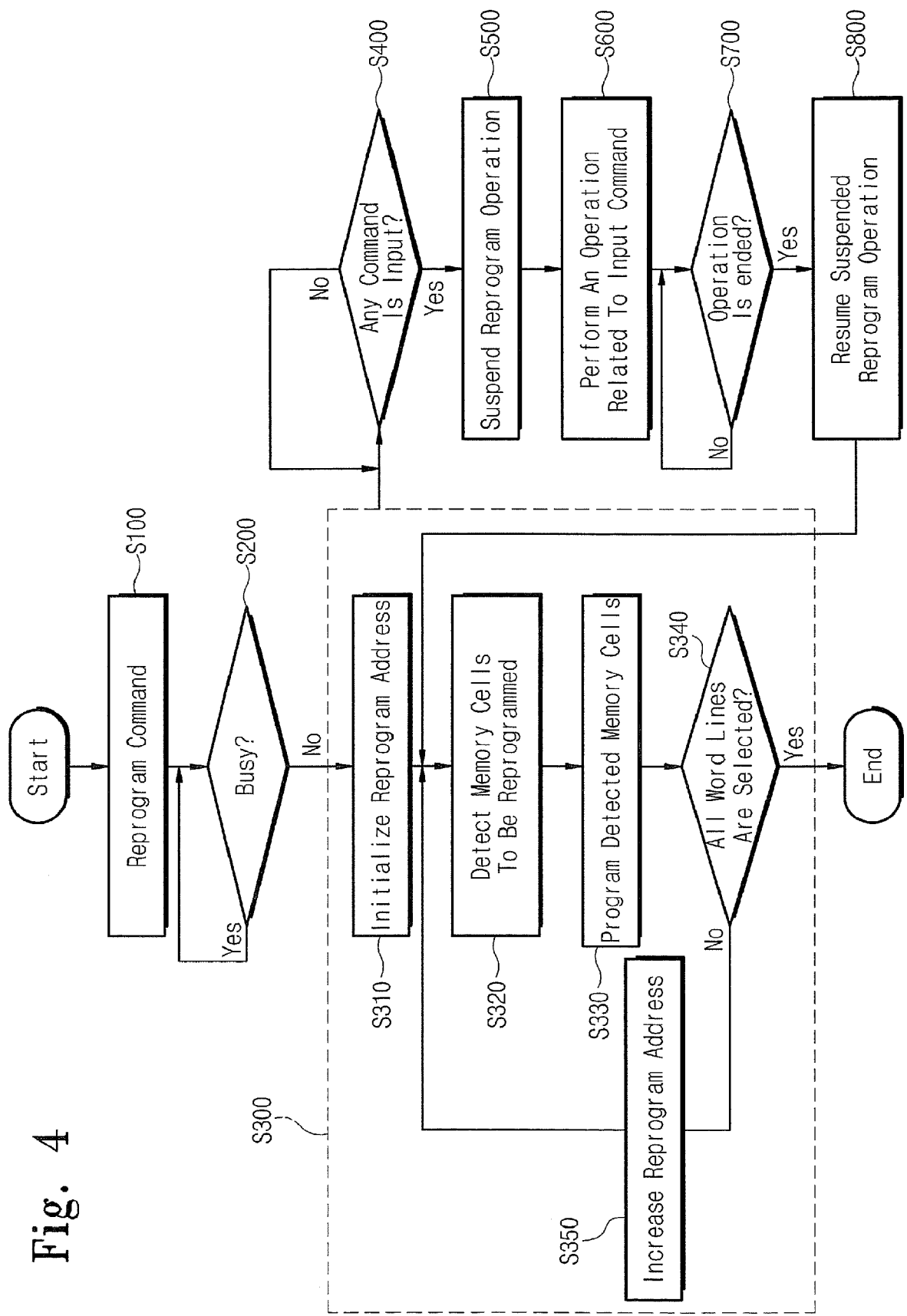
FIG. 4 is a flow chart illustrating reprogramming operations in the nonvolatile memory devices and/or methods shown in FIG. 3.

FIG. 4 is a flow chart illustrating reprogramming operations in a nonvolatile memory device such as the device illustrated in FIG. 3, according to some embodiments of the invention. Reprogramming operations according to some embodiments of the invention will be described with reference to accompanying figures.

According to some embodiments, to initiate a reprogramming operation, a reprogram command is input from an external host or memory controller (S100). Once the reprogram command is received, the command decoder 130 determines whether a reading or writing operation is being carried out (S200). For example, during a reading or writing operation, as discussed above, the read/write controller 140 may provide a busy flag signal to the command decoder 130. During a reading or writing operation, the command decoder 130 may not output the reprogram flag signal to the reprogram controller 150. In other words, the reprogramming operation performed in response to the reprogram command may be delayed until the end of the reading or writing operation. Once the current reading or writing operation has terminated, the command decoder 130 may output a reprogram flag signal to the reprogram controller 150 in accordance with the reprogram command. In response to the reprogram flag signal, the reprogram controller 150 may enable the reprogramming operation (S300). The reprogramming operation may be carried out by way of the procedures described below.

First, the reprogram controller 150 may initialize the address generator 170 in response to the reprogram flag signal (S310). The initialized address is used to select a first word line of the memory cell array 110. This address (i.e., the reprogram address) is provided to the read/write circuit 120. The read/write circuit 120 selects a word line corresponding to the address input by the read/write controller 140, and detects memory cells which are to be reprogrammed (e.g., memory cells having threshold voltages locating between the read voltage Vread and the verifying voltage Vvfy), from memory cells coupled to the selected word line (S320). Next, the read/write circuit 120 programs the detected memory cells to have threshold voltages equal to or higher than the verifying voltage Vvfy (S330). After the reprogramming operation, the read/write controller 140 determines whether all of the word lines have been selected (S340). However, if all the word lines have been selected, the reprogramming operation is terminated. If all the word lines have not been selected yet, the read/write controller 140 informs the reprogram controller 150 that the reprogramming operation has not been completed for all the word lines. The reprogram controller 150 commands the address generator 170 to generate an address for selecting the next word line. Namely, the reprogram address may be incremented to select the next address (S350) and the procedure goes to the step S320. The former steps S320 through S350 may be repeated until all the word lines have been selected.

As described above, during the reprogramming operation, the command decoder 130 determines whether there has been an input of a command such as a read/write command (S400). If a command has been input, the reprogramming operation may be suspended (S500). In particular, when a command is input during the reprogramming operation, the command decoder 130 may output a suspend flag signal to the suspend/resume controller 160. In response, the suspend/resume controller 160 may cause the reprogram controller 150 to suspend the reprogramming operation. During this time, the reprogram address determined by the address generator 170 may be maintained without initialization. Once the reprogramming operation is suspended, the command decoder 130 outputs a flag signal indicative of the input command (e.g., a reading or writing flag signal) to the read/write controller 140. Under control of the read/write controller 140, a reading or writing operation is carried out by the read/write circuit 120 (S600). During this time, the read/write controller 140 outputs the busy flag signal indicating that a reading or writing operation is being carried out.

The command decoder 130 determines whether the reading or writing operation has been completed in response the input command (S700). As discussed above, the completion of the reading or writing operation is indicated by the busy flag signal. After completing the reading or writing operation, the suspended reprogramming operation may be automatically resumed (S800), at which point the procedure goes to step S320. The reprogramming operation may be automatically resumed by providing the resume flag signal to the suspend/resume controller 160 from the command decoder 130. In other words, the command decoder 130 may output the resume flag signal to the suspend/resume controller 160 when the reading or writing operation is completed, and in response the suspend/resume controller 160 may cause the reprogram controller 150 to resume the suspended reprogramming operation. The resumed reprogramming operation may be carried out using the reprogram address that had been generated by the address generator 170 when the reprogramming operation was suspended.

Figure 5:
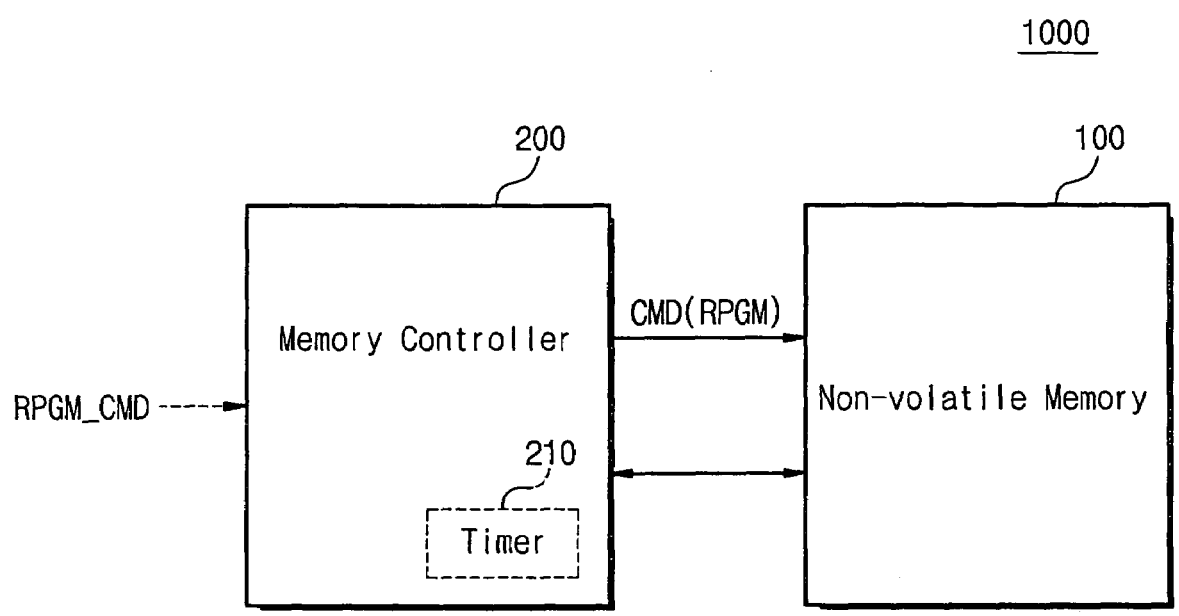
FIG. 5 is a block diagram of a memory system according to some embodiments of the invention including the nonvolatile memory device shown in FIG. 3.

FIG. 5 is a block diagram of memory systems and/or methods according to some embodiments of the invention including a nonvolatile memory device as shown in FIG. 3.

Referring to FIG. 5, a memory system 1000 includes a nonvolatile memory device 100 and a memory controller 200. The nonvolatile memory device 100 may be substantially similar to that shown in FIG. 3. The memory controller 200 is configured to provide the nonvolatile memory device 100 with a reprogram command to initiate a reprogramming operation. The reprogram command may be generated in various ways. For instance, the memory controller 200 may include a timer 210 that is configured to count time periods required for the reprogramming operations. Whenever a predetermined time period set by the timer 210 has passed, the memory controller 200 may output a reprogram command to the nonvolatile memory device 100. In other embodiments in which a timer is not provided in the memory controller 200, the memory controller 200 may output the reprogram command to the nonvolatile memory device 100 whenever the host requests a reprogramming operation, for example, by sending a reprogram command RPGM_CMD to the memory controller 200. The memory controller 200 of a memory system 1000 according to some embodiments of the invention may be configured to assist one or more of the operations described above.

Figure 6:
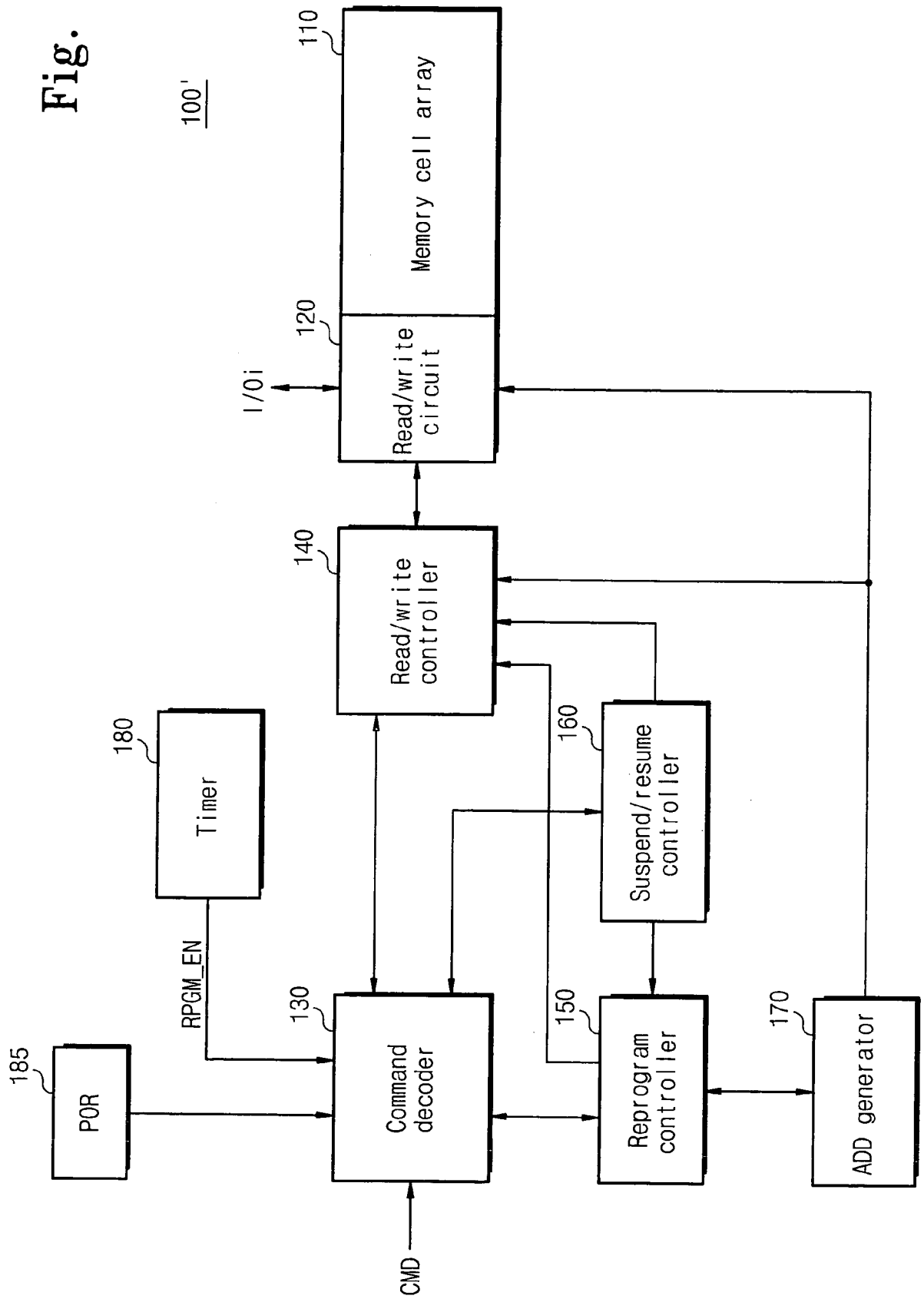
FIG. 6 is a block diagram illustrating nonvolatile memory devices and/or methods in accordance with further embodiments of the present invention.

FIG. 6 is a block diagram illustrating nonvolatile memory devices and/or methods in accordance with further embodiments of the invention.

In FIG. 6, elements substantially similar to those shown in FIG. 3 are provided with the same reference numerals. The nonvolatile memory device 100' shown in FIG. 6 further includes a timer 180. The timer 180 is configured to count a time period between reprogramming operations. Whenever the period set by the timer 180 has elapsed, the timer 180 may generate a reprogram enable signal RPGM_EN. The command decoder 130 may output a reprogram flag signal to the reprogram controller 150 in response to the reprogram enable signal RPGM_EN.

Instead of, or in addition to, the timer 180, a power-on reset circuit POR 185 may be employed in the nonvolatile memory device 100'. The power-on reset circuit POR 185 may generate a reprogram enable signal RPGM_EN at every power-on, in which case the reprogramming operation may be carried out at every power-on. In particular, the command decoder 130 may provide the reprogram flag signal to the reprogram controller 150 in response to a reprogram enable signal RPGM_EN from the power-on reset circuit POR 185 at power-on time. In addition, in embodiments including both a timer 180 and a power-on reset circuit POR 185, the timer 180 may be reset at power-on so that a reprogram enable signal RPGM_EN is not received from the timer 180 while a reprogramming operation is being performed in response to a reprogram enable signal RPGM_EN from the power-on reset circuit POR 185. If a normal read/write command is input during the reprogramming operation, suspending and resuming the reprogramming operation in the manner described above may be automatically initiated without suspend/resume commands from an external host or memory controller.

Although not shown in FIG. 5, it may be understood by those skilled in the art that a power-on reset circuit POR may be used instead of the timer 210 of the memory controller 200 shown in FIG. 5.

As described above, a nonvolatile memory according to some embodiments of the present invention may be able to automatically conduct a reprogramming operation without requiring control from an external means, such as a memory controller or a host. Thus, complex control circuitry (e.g., for providing the suspend/resume commands to the memory device by the memory controller at proper times) may not be required. Thus, it may be possible to reduce or prevent degradation of performance in a system including a nonvolatile memory device according to some embodiments of the invention that may otherwise occur due to a reprogramming operation.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A nonvolatile memory device comprising:
   a memory cell array;
   a command decoder configured to generate a read/write flag signal in response to a read/write command and to generate a reprogram flag signal in response to reprogram command;
   a read/write circuit configured to control reading and writing operations in the memory cell array;
   a read/write controller configured to cause the read/write circuit to perform a reading/writing operation in response to the read/write flag signal provided from the command decoder; and a reprogram controller configured to cause the read/write controller to perform a reprogramming operation in response to the reprogram flag signal provided from the command decoder.

2. A nonvolatile memory device as set forth in claim 1, wherein the command decoder is configured to determine, in response to a reprogramming command, whether a reading/writing operation is being carried out in the memory cell array.

3. A nonvolatile memory device as set forth in claim 2, wherein, if the reading/writing operation is being carried out when the reprogramming command is received by the command decoder, the command decoder is configured to delay the reprogramming operation until the reading/writing operation is complete.

4. A nonvolatile memory device as set forth in claim 3, wherein the command decoder is configured to provide the reprogram controller with a reprogram flag signal to cause a delayed reprogramming operation to be initiated when the reading/writing operation is complete.

5. A nonvolatile memory device as set forth in claim 1, further comprising:
a suspend/resume controller configured to suspend an operation controlled by the reprogram controller or the read/write controller in response to a suspend flag signal provided from the command decoder.

6. A nonvolatile memory device as set forth in claim 5, wherein the command decoder is configured to provide the suspend/resume controller with a suspend flag signal to suspend the reprogramming operation in response to receipt of a read/write command during the reprogramming operation.

7. A nonvolatile memory device as set forth in claim 6, wherein the command decoder is configured to provide the read/write flag signal to the read/write controller in response to suspension of the reprogramming operation and configured to provide the suspend/resume controller with a resume flag signal to resume the suspended reprogramming operation when the reading/writing operation is terminated.

8. A nonvolatile memory device as set forth in claim 7, further comprising:
an address generator configured to generate a reprogram address for the reprogramming operation.

9. A nonvolatile memory device as set forth in claim 8, wherein the address generator is configured to provide the reprogram address to the read/write circuit.

10. A nonvolatile memory device as set forth in claim 7, wherein the reprogram controller is configured to initialize the address generator in response to the reprogram flag signal from the command decoder.

11. A nonvolatile memory device as set forth in claim 9, wherein the address generator is configured to maintain the reprogram address to be used in resuming the suspended reprogramming operation when the reprogramming operation is suspended.

12. A nonvolatile memory device as set forth in claim 1, wherein the command decoder is configured to receive the input information for the reprogramming operation from an external memory controller, a timer and/or a power-on reset circuit.

13. A nonvolatile memory device as set forth in claim 1, further comprising:
a timer configured to generate a reprogram enable signal in response to the passing of a predetermined time for the reprogramming operation.

14. A nonvolatile memory device as set forth in claim 13, wherein the command decoder is configured to provide the reprogram controller with a flag signal indicative of the reprogramming operation in response to the reprogram enable signal.

15. A nonvolatile memory device as set forth in claim 1, further comprising:
a power-on reset circuit configured to generate initializing information at a power-on time.

16. A nonvolatile memory device as set forth in claim 15, wherein the command decoder is configured to provide the reprogram controller with a flag signal indicative of the reprogramming operation in response to the initializing information.

17. A memory system, comprising:
a memory controller configured to generate a reprogram command indicative of a reprogramming operation and a read/write command indicative of a read/write operation; and
a nonvolatile memory device comprising:
a memory cell array;
a command decoder configured to generate a read/write flag signal in response to the read/write command from the memory controller and to generate a reprogram flag signal in response to the reprogram command from the memory controller;
a read/write circuit configured to control reading and writing operations in the memory cell array;
a read/write controller configured to cause the read/write circuit to perform a reading/writing operation in response to the read/write flag signal provided from the command decoder; and
a reprogram controller configured to cause the read/write controller to perform a reprogramming operation in response to the reprogram flag signal provided from the command decoder.

18. A nonvolatile memory device as set forth in claim 16, wherein the memory controller comprises a timer configured to count a predetermined time for the reprogramming operation and configured to provide the command decoder with the reprogram command in response to the passing of the predetermined time.

19. A method of operating a nonvolatile memory device, comprising:
receiving a signal indicative of a reprogramming operation;
determining whether the memory device is in a busy state in response to the signal indicative of the reprogramming operation;
delaying the reprogramming operation if the memory device is in the busy state;
determining when the memory device has transitioned from the busy state to a standby state; and
executing the delayed reprogramming operation when the memory device has turned to the standby state from the busy state.

20. A method as set forth in claim 19, further comprising:
suspending the reprogramming operation in response to a request for a reading/writing operation during the reprogramming operation.

21. A method as set forth in claim 20, further comprising:
resuming the suspended reprogramming operation in response to a completion of the requested reading/writing operation.

22. A method as set forth in claim 19, wherein the signal informing of the reprogramming operation is provided from an external memory controller.

23. A method as set forth in claim 22, wherein the external memory controller generates a signal indicative of the reprogramming operation in response to an external request.

24. A method as set forth in claim 22, wherein the external memory controller generates a signal indicative of the reprogramming operation at predetermined time intervals.

25. A method as set forth in claim 22, wherein the signal indicative of the reprogramming operation is generated from a timer included in the nonvolatile memory device.

26. A method as set forth in claim 19, wherein the signal indicative of the reprogramming operation is generated from a power-on reset circuit coupled to the nonvolatile memory device.

* * * * *